(12) United States Patent
Daniels et al.

(10) Patent No.: US 9,614,348 B2
(45) Date of Patent: Apr. 4, 2017

(54) LIGHT SOURCE ARRANGEMENT INCLUDING SEMICONDUCTOR LIGHT SOURCE

(71) Applicant: OSRAM GmbH, Munich (DE)

(72) Inventors: Martin Daniels, Berlin (DE); Ulrich Hartwig, Berlin (DE); Joerg Sorg, Regensburg (DE)

(73) Assignee: Osram GmbH, Munich (DE)

( * ) Notice: Subject to any disclaimer, the term of this patent is extended or adjusted under 35 U.S.C. 154(b) by 78 days.

(21) Appl. No.: 14/662,272

(22) Filed: Mar. 19, 2015

(65) Prior Publication Data

US 2015/0270682 A1 Sep. 24, 2015

(30) Foreign Application Priority Data

Mar. 24, 2014 (DE) .................. 10 2014 205 450

(51) Int. Cl.
*G03B 21/20* (2006.01)
*H01S 5/00* (2006.01)
(Continued)

(52) U.S. Cl.
CPC ......... *H01S 5/0071* (2013.01); *F21S 48/1159* (2013.01); *F21S 48/1225* (2013.01); *F21S 48/1317* (2013.01); *F21S 48/1747* (2013.01); *F21V 5/007* (2013.01); *F21V 7/05* (2013.01); *G03B 21/16* (2013.01);
(Continued)

(58) Field of Classification Search
CPC ... F21K 9/50; F21V 5/007; F21V 7/05; F21V 29/50; G03B 21/2066; G03B 21/16; H01S 5/0071; H01S 5/405; H01S 5/02216; H01S 5/02276; H01S 5/02288; F21S 48/1757; F21Y 2101/025
See application file for complete search history.

(56) References Cited

U.S. PATENT DOCUMENTS 5,216,544 A 6/1993 Horikawa et al.
6,356,577 B1 3/2002 Miller
(Continued)

FOREIGN PATENT DOCUMENTS

WO 2013182450 A1 12/2013

OTHER PUBLICATIONS

German Search Report based an DE application 10 2014 205 450.8 (7 pages) dated Sep. 26, 2015.

*Primary Examiner* — Sultan Chowdhury
*Assistant Examiner* — Magda Cruz
(74) *Attorney, Agent, or Firm* — Viering, Jentschura & Partner mbB

(57) ABSTRACT

A light source arrangement is provided. The light source arrangement may include a plurality of semiconductor laser light sources, each having an optical axis. The semiconductor laser light sources are arranged in such a way that their optical axes are oriented parallel to one another so that respective laser light emission sides of the semiconductor laser light sources point in the same spatial direction. The light source arrangement may further include a deflection unit configured to collect and influence beam paths of the laser light emitted by the semiconductor laser light sources in order to form a beam bundle. The semiconductor laser light sources are arranged on a surface of a carrier, distributed at least two-dimensionally over the surface.

15 Claims, 10 Drawing Sheets

(51) Int. Cl.
| | |
|---|---|
| *H01S 5/40* | (2006.01) |
| *F21V 5/00* | (2015.01) |
| *F21V 7/05* | (2006.01) |
| *F21S 8/10* | (2006.01) |
| *G03B 21/16* | (2006.01) |
| *F21V 29/50* | (2015.01) |
| *H01S 5/022* | (2006.01) |
| *F21Y 101/00* | (2016.01) |
| *F21Y 115/30* | (2016.01) |

(52) U.S. Cl.
CPC ..... *G03B 21/2013* (2013.01); *G03B 21/2033* (2013.01); *G03B 21/2066* (2013.01); *H01S 5/405* (2013.01); *F21S 48/1757* (2013.01); *F21V 29/50* (2015.01); *F21Y 2101/00* (2013.01); *F21Y 2115/30* (2016.08); *H01S 5/02216* (2013.01); *H01S 5/02276* (2013.01); *H01S 5/02288* (2013.01)

(56) References Cited

U.S. PATENT DOCUMENTS

| | | | |
|---|---|---|---|
| 7,396,136 B2 * | 7/2008 | Kim | F21V 7/0091 348/801 |
| 2004/0252743 A1 | 12/2004 | Anikitchev et al. | |
| 2004/0252744 A1 * | 12/2004 | Anikitchev | G02B 27/0977 372/100 |
| 2004/0257661 A1 * | 12/2004 | Gao | G02B 27/095 359/627 |
| 2010/0302514 A1 | 12/2010 | Silverstein et al. | |
| 2011/0103056 A1 | 5/2011 | Wolak et al. | |

\* cited by examiner

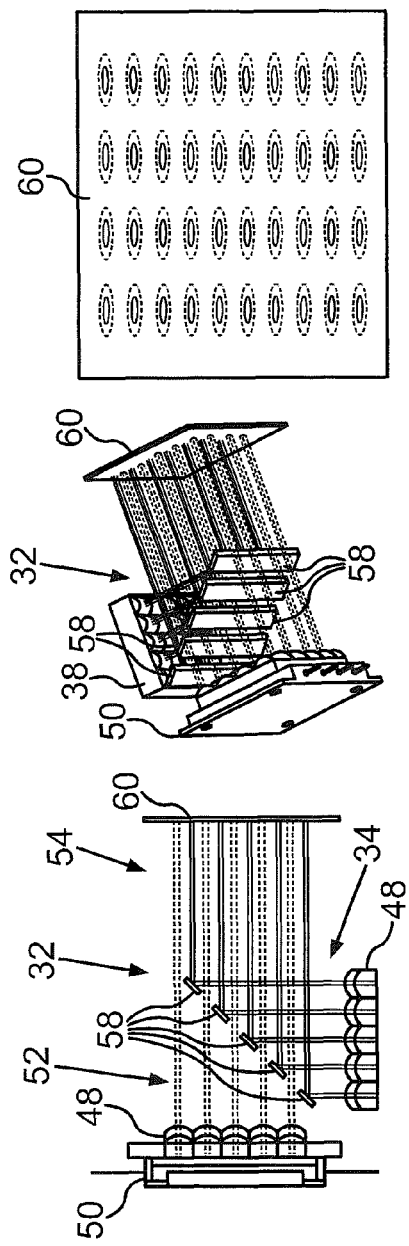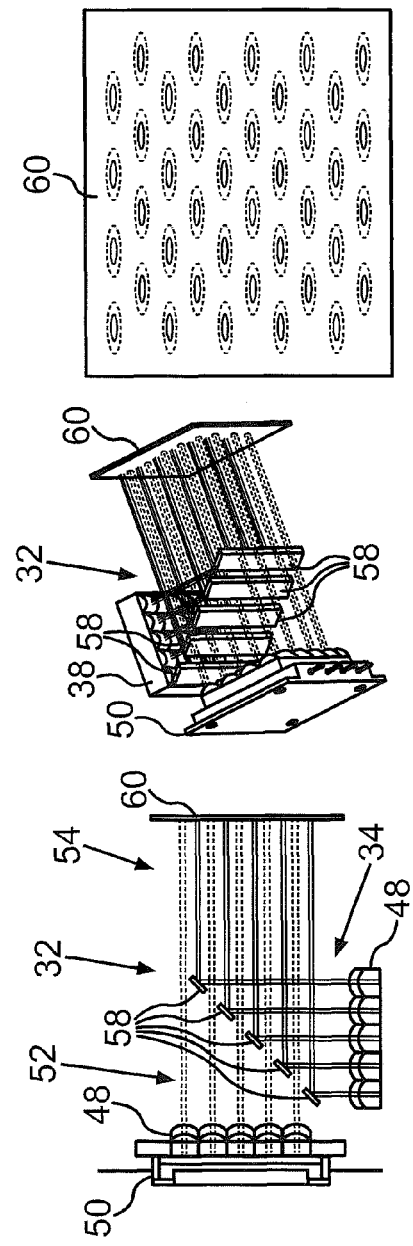

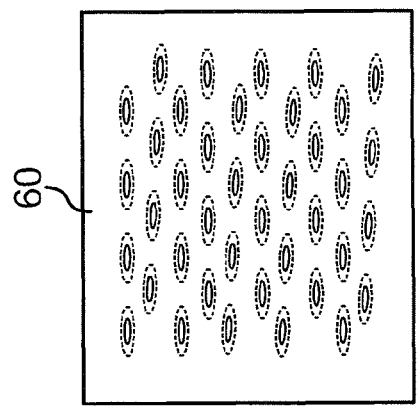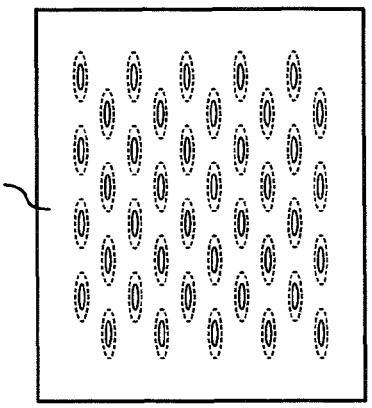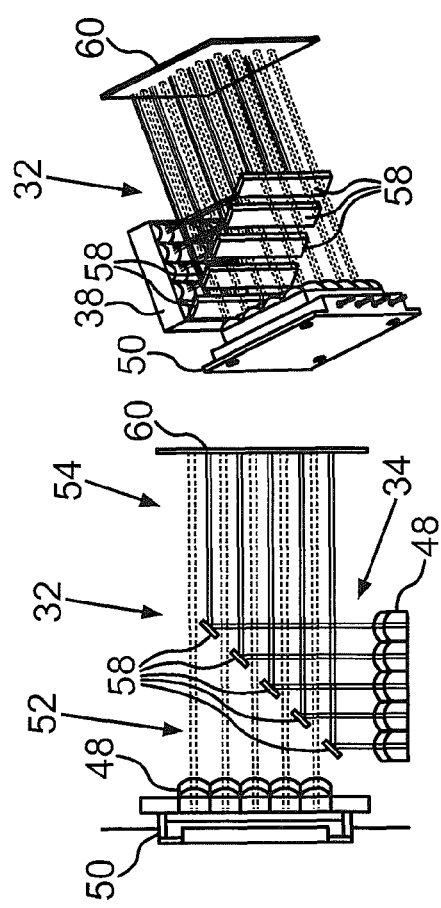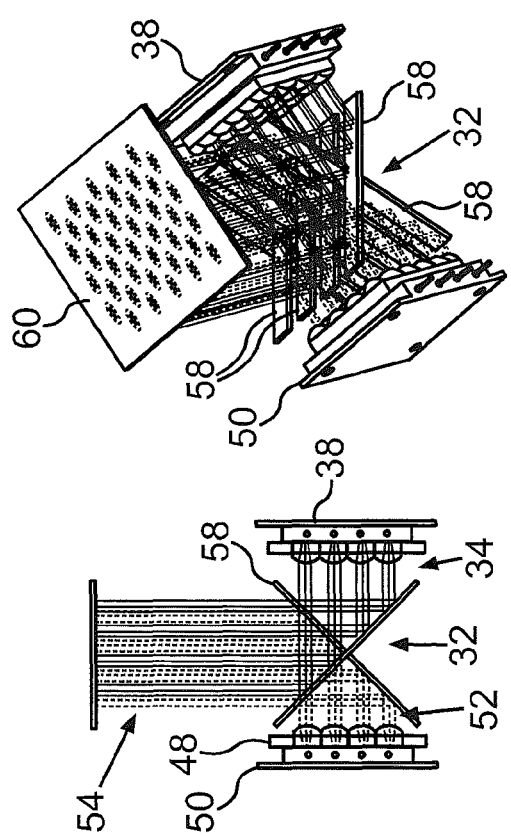
Fig.12
Fig.13

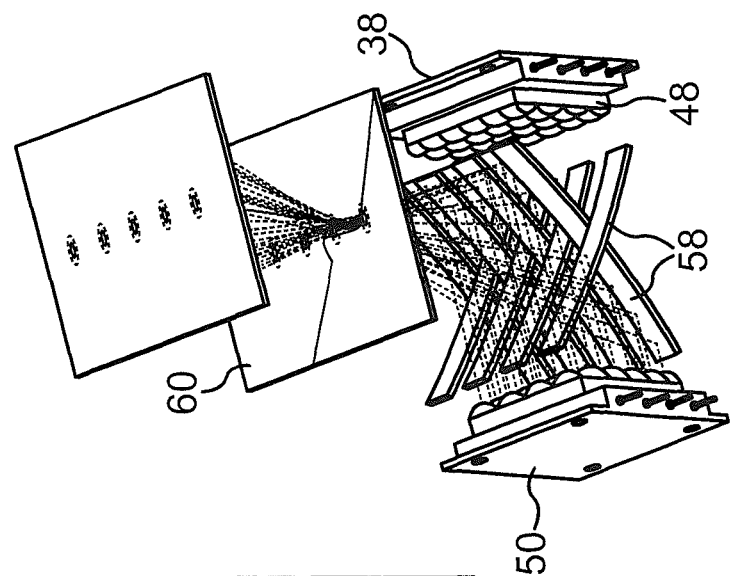
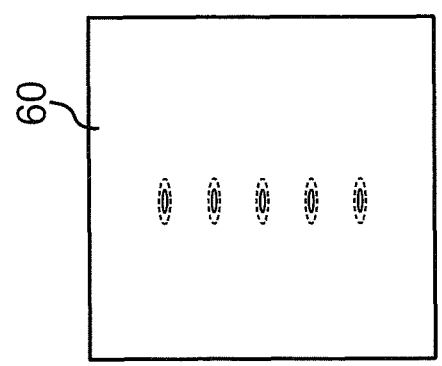
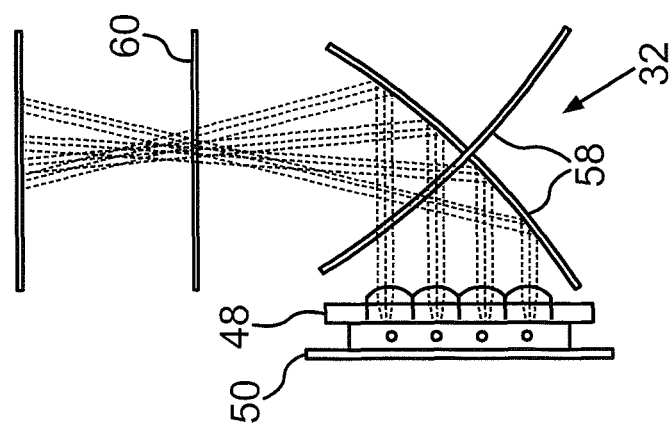
Fig.14

LIGHT SOURCE ARRANGEMENT INCLUDING SEMICONDUCTOR LIGHT SOURCE

CROSS-REFERENCE TO RELATED APPLICATION

This application claims priority to German Patent Application Serial No. 10 2014 205 450.8, which was filed Mar. 24, 2014, and is incorporated herein by reference in its entirety.

TECHNICAL FIELD

Various embodiments relate generally to a light source arrangement including a plurality of semiconductor laser light sources, each having an optical axis. The semiconductor laser light sources are arranged in such a way that their optical axes are oriented parallel to one another so that respective laser light emission sides of the laser light emitted by the semiconductor laser light sources point in the same direction. The light source arrangement may further include a deflection unit for collecting and influencing beam paths of the laser light emitted by the semiconductor laser light sources in order to form a beam bundle. Furthermore, various embodiments relate generally to a projector lamp including a housing having a light exit opening and a light source arrangement arranged in the housing.

BACKGROUND

Light source arrangements of the generic type are used as light-emitting means for projector lamps which need to provide a high luminous efficacy for a wide variety of lighting purposes. Projector lamps of the generic type are, for example, vehicle headlamps, lighting devices for data and video projection and for digital cinema film projection, effect projector lamps in the entertainment industry and lighting devices for technical, industrial and medical applications. The luminous efficacies desired for such purposes generally require very voluminous light sources. The conventional light sources of the generic type furthermore may have the disadvantage that they require a high degree of maintenance and are restricted in respect of reliability. Furthermore, their efficiency is limited. These requirements have made light sources based on semiconductors appear to be unsuitable until now. Light sources based on semiconductors are, for example, light-emitting diodes or else semiconductor laser diodes. However, such light sources are very restricted in respect of the luminous efficacy, so that, at best, very voluminous arrangements with a very large number of corresponding semiconductor light sources need to be provided, which furthermore require a complex, voluminous and expensive deflection unit in order to be able to focus the multiplicity of light beams generated by the light sources in a suitable manner in order that the desired lighting effect can be achieved.

Furthermore, use of conventional semiconductor laser light sources requires particular measures, in particular also in respect of the fact that semiconductor laser diodes are available at present only with an optical power of a few watts. At desired total optical powers of 100 W or more, therefore, a corresponding number of semiconductor laser diodes need to be connected to one another and to be operated jointly, wherein the laser light beams generated thereby need to be combined via a suitable deflection unit. Owing to the comparatively large number of individual semiconductor laser light sources, a physical size which is determined critically by the number and arrangement of the semiconductor laser light sources and the deflection unit results for the conventional light source arrangement. If a high luminous efficacy is desired, the system integration has proven to be very complex.

Such a conventional light source arrangement is disclosed in U.S. Pat. No. 6,356,577. In this case, a plurality of semiconductor laser light sources arranged in rows in a single row are arranged in connection with a deflection unit in such a way that the laser light beams provided by the semiconductor laser light source arrangements formed in this way are deflected onto a common beam plane. For this purpose, a deflection unit is provided, which is formed from a number of mirror elements connected to one another in the direction of the row and which deflects the laser light beams provided by the semiconductor laser light source arrangements laterally offset with respect to one another onto the common beam plane. The result of U.S. Pat. No. 6,356,577 is that the semiconductor laser light source arrangements arranged in rows can be arranged spaced apart from one another, so that mutual influencing, in particular as regards thermal loading, can be reduced. At the same time, this teaching does entail the disadvantage, however, that the light source arrangement based thereon requires a very voluminous design with the further disadvantages associated therewith as regards beam quality and cost. The use of such deflection units as are required for the abovementioned teaching has proven to be complex in terms of design and furthermore requires a very large amount of installation space. Furthermore, comparatively long beam paths are required in the deflection unit, which counteract a reduction in the physical size. Finally, the arrangement of the semiconductor laser light source arrangements in the form of rows with respect to the deflection unit requires increased mechanical complexity in order to be able to achieve the required accuracy for the beam guidance or deflection of the laser light beams. For the manufacture of modern, compact projector lamps and projection units, in particular for mobile use, for example in the case of vehicles or in the case of video projection, this design is unsuitable.

SUMMARY

A light source arrangement is provided. The light source arrangement may include a plurality of semiconductor laser light sources, each having an optical axis. The semiconductor laser light sources are arranged in such a way that their optical axes are oriented parallel to one another so that respective laser light emission sides of the semiconductor laser light sources point in the same spatial direction. The light source arrangement may further include a deflection unit configured to collect and influence beam paths of the laser light emitted by the semiconductor laser light sources in order to form a beam bundle. The semiconductor laser light sources are arranged on a surface of a carrier, distributed at least two-dimensionally over the surface.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 10 shows, in a left-hand region, a schematic sectional illustration of a deflection unit for combining the laser light from two carriers arranged at right angles to one another in accordance with various embodiments, wherein the deflection unit has strip mirrors for the laser light of one of the two carriers, a corresponding illustration in perspective view in the center, and an illustration of a radiation field of the light source arrangement generated by the deflection unit in a right-hand region of FIG. 10, FIG. 11 shows, corresponding to the illustration shown in FIG. 10, in the left-hand region a perspective sectional view of a further light source arrangement in accordance with various embodiments as in FIG. 10, in a central region the corresponding perspective illustration with respect to the sectional view in the left-hand region and in the right-hand region the illustration of a radiation field generated by the deflection unit, wherein in this case, in contrast to FIG. 10, the laser beams are generated offset with respect to one another, FIG. 12 shows an illustration as explained previously in relation to FIGS. 10 and 11, wherein, in the left-hand region, again a schematic sectional view of a further configuration of a light source arrangement in accordance with various embodiments is provided, in which, in contrast to the configuration shown in FIG. 11, the deflection unit has strip mirrors which effect asymmetrical reflection, in the central region of FIG. 12 again a perspective schematic view and, in the right-hand region, the illustration of the radiation field generated by the deflection unit with asymmetrically distributed light beams, FIG. 13 shows, on the basis of the illustration shown in FIG. 10, in the left-hand region a schematic sectional view of two mutually opposite carriers of a further light source arrangement in accordance with various embodiments, in which the laser light generated by the carriers is deflected in each case via strip mirrors assigned to the carriers into a common radiation field, in the central view a corresponding perspective illustration of the arrangement and, in the right-hand region of FIG. 13, an illustration of the radiation field generated by the deflection unit, FIG. 14 shows, in the left-hand region, a schematic sectional view of a further light source arrangement including mutually opposite carriers in accordance with various embodiments, wherein, in the left-hand view only one of the two carriers is illustrated and the deflection unit has strip mirrors which are curved, in the right-hand region of FIG. 14 a corresponding perspective illustration of the light source arrangement in accordance with the left-hand sectional illustration and, in the central region, the illustration of a radiation field generated by the deflection unit of this configuration.

DESCRIPTION

Figure 1:
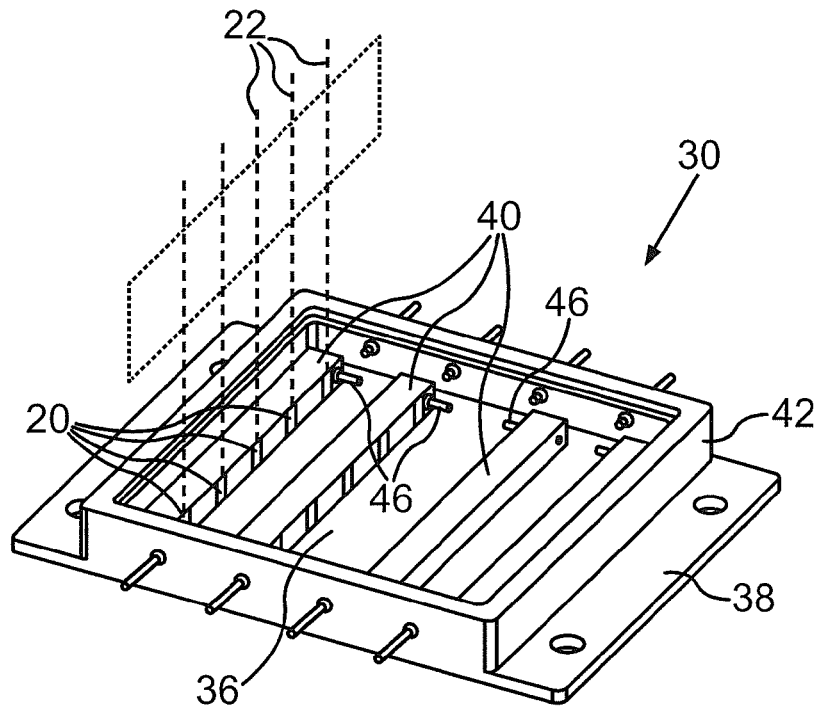
FIG. 1 shows a schematic perspective view of a light source arrangement including a carrier in accordance with various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments may improve a light source arrangement of the generic type in respect of its design. Correspondingly, an improved projection lamp may be provided desired.

Various embodiments provide a light source arrangement as claimed in independent claim 1. In addition, the various embodiments provide a projection lamp as claimed in the further independent claim 13. Further configurations are set forth on the basis of features of the dependent claims.

Various embodiments provide a light source arrangement of generic type and propose that the semiconductor laser light sources are arranged on a surface of a carrier, distributed at least two-dimensionally over the surface.

As regards projector lamps, it is proposed e.g. that the light source arrangement is designed in accordance with various embodiments.

A basis for various embodiments may therefore be the arrangement of a plurality of semiconductor laser light sources on a surface of a carrier. In this case, the semiconductor laser light sources may be arranged so as to be distributed arbitrarily over the surface of the carrier, for example. However, they may be arranged in a grid pattern, for example with columns and rows. In various embodiments, the semiconductor laser light sources are arranged adjacent to one another in a plane which is oriented transversely, e.g. perpendicularly, to the optical axes of the semiconductor laser light sources. The plane may be flat and may extend without any curvature. Furthermore, however, provision may also be made for the surface to have, at least partially, a curvature or else shoulders, so that the semiconductor laser light sources may be located on very different levels in respect of the respective laser light emission sides.

The carrier provides the surface for the semiconductor laser light sources which are fastened on this surface. The fastening can be performed cohesively, for example, by virtue of the semiconductor laser light sources being fastened, for example, by adhesive bonding, welding, soldering or the like. Furthermore, further connection possibilities, e.g. also using mechanical fastening means, can naturally also be considered, which connection possibilities enable a connection between the carrier and the semiconductor laser light sources, for example thermal or further chemical connection possibilities. As an alternative or in addition, the semiconductor laser light sources may be introduced or integrated monolithically into the carrier substrate. In various embodiments, the carrier has a thermal conductivity which makes it possible to pass on heat generated owing to the proper operation of the semiconductor laser light sources from the semiconductor laser light sources. For this purpose, the carrier can be connected to a thermal sink, for example a cooling body, or heat sinks, for example heat pipes, micro cooling fluid channels and evaporation arrangements, can be integrated in the carrier substrate.

Furthermore, provision can be made for the carrier to also have electrical lines, which make it possible to be able to supply the electrical energy to the semiconductor laser light sources which is required for proper operation thereof.

The carrier may also provide a housing, e.g. a closed housing, so that the semiconductor laser light sources are arranged in a protected manner. As a result, the semiconductor laser light sources may be arranged so as to be protected from, inter alia, external effects, for example owing to atmospheric ambient conditions or else from mechanical effects. The housing may have a transparent cover in the region of the laser light emission sides of the semiconductor laser light sources, said transparent cover enabling as much transmission as possible for the laser light of the semiconductor laser light sources. Such a cover may consist, for example, of a correspondingly adapted glass or plastic which provides a high level of transmission, e.g. for the wavelength range of the laser light generated by the semiconductor laser light sources, and/or is correspondingly adapted and/or has a high thermal conductivity, for example sapphire.

The carrier itself can be formed from a solid material, for example, e.g. from a metal such as steel, aluminum, copper, alloys thereof and/or the like, but also from a ceramic material such as, for example, aluminum oxide or the like. In various embodiments, a material is selected which has good thermal conductivity.

In accordance with a further aspect of various embodiments, it is proposed that the carrier has at least two bar-shaped carrier elements, on which the semiconductor laser light sources are arranged, wherein the carrier elements preferably are arranged on a common carrier frame of the carrier parallel to one another in a plane oriented transversely to the optical axes. By the carrier elements, a modular design can be achieved which makes it possible to produce the light source arrangement on the basis of the carrier and the carrier elements in a simple manner. For example, provision can be made for the carrier elements to be provided equipped with semiconductor laser light sources as prefabricated assemblies and, if required, to be equipped with carrier elements in order to produce a desired carrier with a desired number of semiconductor laser light sources. The carrier elements may be formed from the same material as the carrier. Furthermore, the carrier elements may be fastened detachably to the carrier. In various embodiments, the carrier elements have a surface which is opposite the light emission sides of the semiconductor laser light sources and which lies in a flat plane with the corresponding surfaces of the further carrier elements, with the result that it is easily possible to make contact with a likewise planar surface of a cooling unit. Furthermore, provision may naturally be made for these two surfaces to also be designed so as to be matched to one another so that a corresponding favorable thermal contact can be achieved. The carrier elements may be arranged spaced apart from one another on the carrier, e.g. spaced apart transversely to a direction of extent of the carrier elements. Naturally, the carrier elements may also be arranged directly adjacent to one another, e.g. adjoining one another. The carrier elements may have a single-row, linear arrangement of the semiconductor laser light sources. Owing to the arrangement of the carrier elements on the carrier, a matrix arrangement of the semiconductor laser light sources, e.g. in columns and rows, may be achieved.

The light source arrangement of various embodiments may include a cooling unit arranged on the carrier. The cooling unit may be formed by a cooling body, which makes contact, by a corresponding contact surface, with a contact surface of the carrier in order to be able to produce heat transfer which is as effective as possible. The cooling body may be cooled by a fluid such as air, another gas or else by a liquid such as water or the like, for example. As a result, it may be possible to achieve a situation whereby a high power density in respect of an optical power formed by the totality of the semiconductor laser light sources is achieved, so that a compact design of the light source arrangement is made possible. Owing to the good heat dissipation as a result of the structural conditions in the case of the light source arrangement according to various embodiments, a high total luminous efficacy of the laser light generated by the semiconductor laser light sources can be achieved. The high degree of compactness of the light source arrangement of various embodiments furthermore makes it possible to also design the deflection unit to be correspondingly compact and, as a result, to save not only on volume and weight but also on costs. At the same time, it is possible to achieve a situation whereby the path lengths of the laser light are reduced so that the accuracy of the light source arrangement according to various embodiments may be increased.

In accordance with various embodiments, it is proposed that the semiconductor laser light sources arranged together on a carrier are controllable individually or in groups. As a result, it is possible to achieve a situation whereby different lighting effects may be generated using the light source arrangement. Thus, for example, light patterns or the like can be generated using the light source arrangement. For this purpose, the carrier may have corresponding electrical lines and/or energy supply connections for independently controlling the semiconductor laser light sources or groups of semiconductor laser light sources for the semiconductor laser light sources. In various embodiments, provision may be made for the semiconductor laser light sources to be controllable on a carrier element basis, i.e. the semiconductor laser light sources arranged on a carrier element form a group, which can be controlled jointly. Naturally, two or more groups of jointly controllable semiconductor laser light sources can also be formed on one carrier element. This may also be advantageous, inter alia, when the semiconductor laser light sources emit laser light of different wavelengths so that color effects or conversion properties of a conversion element can be adjusted by the laser light source arrangement in a desired manner In accordance with various embodiments, it is proposed that energy supply terminals for the semiconductor laser light sources are arranged at front-side ends of the bar-shaped carrier element. As a result, it is possible for the carrier elements to be connected as modules to the carrier in a highly flexible manner. At the same time, energy may be supplied to the semiconductor laser light sources in a simple and reliable manner In accordance with various embodiments, it is proposed that a lens array is arranged on the carrier on the semiconductor laser light source side, said lens array providing a lens for the laser light emitted by the respective semiconductor laser light source for each semiconductor laser light source. As a result, it may be possible to achieve a good luminous efficacy and to use this for the light source arrangement even in the case of semiconductor laser light sources with poor focusing. In various embodiments, the lens array is designed so as to be appropriate at least for a carrier element and may be connected thereto. Furthermore, however, the lens array can also be formed integrally for all of the semiconductor laser light sources of the carrier and can form the cover, for example. As a result, a particularly simple embodiment of the lens array may be achieved, which is simple to fit and enables precise orientation of all of the lenses in the lens array at the same time with respect to the carrier. The lens array may be fastened on the carrier or on a carrier frame of the carrier by mechanical fastening means, for example. However, it is also possible for it to be connected directly to the respective laser light emission sides of the semiconductor laser light sources.

In accordance with a further configuration, it is proposed that at least two carriers are provided which are arranged at an angle physically with respect to one another, wherein the deflection unit is designed to influence the beam paths of all of the semiconductor laser light sources of at least one first one of the carriers in such a way that they form, together with the beam paths of all of the semiconductor laser light sources of a second of the carriers, a common beam bundle. In various embodiments, the deflection unit is configured in such a way that a radiation field formed by the beam paths of all of the semiconductor laser light sources of the second carrier is maintained in respect of its dimensions once it has been combined with the laser light sources of the first carrier. As a result, it is possible to achieve a situation whereby a radiation field with a multiplicity of laser light beams is provided, without the dimensions of the radiation field needing to be enlarged thereby. This makes it possible to achieve a very compact structural unit of the light source arrangement, e.g. also in respect of the deflection unit, which can be dimensioned so as to be correspondingly small owing to the small dimensions of the radiation field. A radiation field with a high optical power density can be achieved.

In accordance with a further configuration, it is proposed that the deflection unit has a polarization beam splitter, which is designed to deflect the beam paths from the semiconductor laser light sources, arranged on the carriers, of the two carriers in order to form e.g. the common beam bundle. In this way too, it is possible to achieve a situation whereby the radiation field does not need to be enlarged when the laser light beams of the semiconductor laser light sources are combined. Naturally, the polarization beam splitter can also be combined with the abovementioned configuration of the deflection unit, e.g. when a plurality of carriers is provided whose laser light is intended to be combined to form a common radiation field in order to form a common beam bundle.

In accordance with various embodiments, it is proposed that the deflection unit has a number of strip mirrors, which are assigned at least to the first of the carriers and are designed to influence the laser light emitted by the semiconductor laser light sources arranged on the respectively assigned carrier in order to form in particular the common beam bundle. With this configuration as well, it is possible to achieve a situation whereby the laser light from a plurality of carriers is combined to form a common beam bundle, wherein the dimensions of a radiation field formed hereby can be largely maintained. Furthermore, provision is made for in each case one strip mirror to be assigned to one of the carrier elements, in the case of carriers which are provided with carrier elements, and for the emitted laser light of the semiconductor laser light sources of the respective carrier elements to be influenced in a desired manner. Furthermore, with the strip mirrors naturally also focusing can be achieved, with the result that, for example, the lens array may be dispensed with.

In accordance with a development, it is proposed that the strip mirrors are designed to effect influencing of the laser light emitted by semiconductor laser light sources arranged on the first carrier whilst maintaining dimensions of a radiation field of the emitted laser light of the second of the carriers. With this configuration, it is therefore likewise at least possible to maintain the radiation field substantially even once all of the laser light beams from all of the semiconductor laser light sources have been combined.

In accordance with a further configuration, it is proposed that the deflection unit has an optically adjustable influencing element. The optically adjustable influencing element can be formed, for example, by an adjustable lens and/or a deflecting element such as an adjustable mirror. Furthermore, provision can naturally also be made for the mirror to be capable of being adjusted in respect of angular setting and/or a curvature of its surface. As a result, the deflection unit can be adapted in a simple manner to different desired influencing or deflecting properties.

One configuration provides that the semiconductor laser light sources are arranged in rows and columns on the surfaces of the carriers and are designed to each correspondingly generate a first and second beam bundle formed in columns and rows, wherein the strip mirrors are designed to deflect the first beam bundle generated by the semiconductor laser light sources arranged on the first of the carriers in such a way that the first beam bundle is offset with respect to the second beam bundle generated by the semiconductor laser light sources arranged on the second carrier in respect of the column and row arrangement, e.g. by approximately half a row and/or half a column. As a result, it is possible to achieve a situation whereby, when the beam bundles of a plurality of carriers are combined, a resultant beam bundle substantially has the same dimensions as a beam bundle of one of the carriers on its own. As a result, a considerably larger optical power density can be achieved. In various embodiments, the strip mirrors are designed to orientate the first and second beam bundles in the same spatial direction, i.e. parallel to one another. The first and second beam bundles can thus be superimposed, wherein laser light beams of the beam bundles may not coincide. The offsetting also includes arranging.

Furthermore, it is proposed that the strip mirrors are designed to generate an offset in the manner of a shift, tilt and/or rotation of the first and second beam bundles with respect to one another. The configuration makes it possible to suppress optical system periodicities which could entail any undesired optical effects, in particular also in relation to a following optical element, by virtue of a breakage of symmetry being made possible hereby.

Furthermore, it is proposed that two carriers, each having semiconductor laser light sources arranged in rows and columns on one surface of each carrier, are arranged with respect to one another in such a way that their surfaces with the semiconductor laser light sources are opposite one another. In addition, a deflection unit which has a number of strip mirrors is arranged between the two carriers. In this case, in each case one strip mirror is assigned to each column or row with semiconductor laser light sources of the two carriers so that the beam paths of the semiconductor laser light sources are deflected by the strip mirrors in the same half-space.

In one development, the strip mirrors are additionally tilted alternately to one or the other carrier such that, in the process, the tilt angle enclosed between the beam paths of the assigned semiconductor laser light sources of the respective carrier and the surface normal of the relevant mirror surface is at least approximately 45°. In this development, a common beam bundle is formed from the beam paths of the semiconductor laser light sources of two mutually opposite carriers. Thus, a high and nevertheless homogeneous laser power surface density can be achieved on a conversion element.

In a further development, in the case of at least one strip mirror, the surface facing a column or row is curved such that at least two of the beam paths of the assigned semiconductor laser light sources cross over at a spacing from this strip mirror. In addition, the at least one strip mirror can be curved such that all of the beam paths of the assigned semiconductor laser light sources cross over at a spacing from this strip mirror. In this way, at the crossing point of the beam paths of all of the semiconductor laser light sources assigned to the curved strip mirror, a particularly high laser power surface density is achieved. Before and after the crossing point, the laser power surface density is correspondingly lower. By corresponding positioning of a conversion element, this can advantageously be used for changing requirements in respect of the suitable laser power surface density. Finally, all of the strip mirrors can also be curved in such a way that all of the beam paths of the assigned semiconductor laser light sources cross over at a spacing from the respective strip mirror.

On the projection lamp side, it is furthermore proposed that the semiconductor laser light sources of the light source arrangement are controllable by a control unit, e.g. individually or in groups, in order to emit light in at least two correct lighting states using the projection lamp. For this purpose, a separate control unit can be provided. The control unit can also at least partially be part of the projection lamp. As a result, lighting effects can be provided using the projection lamp in virtually any desired manner. In various embodiments, this configuration is also suitable for reducing undesired parasitic light without needing to perform any mechanical interventions on the projection lamp itself.

Furthermore, it is proposed that the projection lamp is designed to activate different semiconductor laser light sources of the light source arrangement for setting different lighting states. This makes it possible to provide lighting states for which different light-emitting means would otherwise be required using only a single light source arrangement as light-emitting means. For example, in the case of a vehicle headlamp, provision can be made for both the lower beam and the upper beam to be generated using the light source arrangement according to various embodiments.

Finally, it is proposed that the projection lamp is a vehicle headlamp, which is designed to set different vehicle lighting systems manually and/or depending on a driving state of the vehicle by means of the light source arrangement. For this purpose, the control unit can be provided, by which the light source arrangement can be controlled in a desired manner. For example, the driver of the vehicle can set the light source arrangement of the projection lamp in a desired manner for light generation by manual actuation. It is proven to be particularly advantageous if automatization is realized which enables automatic adjustment of the projection lamp. Provision can thus be made for the light source arrangement to be adjusted depending on a present steering wheel setting for light generation. Thus, for example, illumination of bends or the like can be achieved. Furthermore, provision can be made for illumination of the street to be set differently depending on oncoming traffic. If there is no oncoming traffic, different illumination of the street can be provided, for example. As soon as oncoming traffic is detected by a suitable sensor, the illumination of the street is restricted to a degree which is appropriate for the oncoming traffic.

FIG. 1 shows a perspective schematic illustration of a light source arrangement 30 in accordance with various embodiments including a plurality of semiconductor laser light sources 20 each having an optical axis 22, which semiconductor laser light sources are in this case in the form of semiconductor lasers. The semiconductor lasers 20 are arranged in such a way that their optical axes 22 are oriented parallel to one another, so that respective laser light emission sides 24 of the semiconductor lasers 20 point in the same spatial direction 18 in relation to the laser light 26 emitted by the semiconductor lasers 20. The light source arrangement 30 may furthermore have a deflection unit 32 for converging and influencing beam paths 44 of the laser light emitted by the semiconductor lasers 20 in order to form a beam bundle 34. In accordance with various embodiments, the semiconductor lasers 20 are arranged on a surface 36 of a carrier 38 so as to be distributed two-dimensionally over the surface 36. Such a carrier is also referred to as "multi-die package" (MDP).

The carrier 38 is in this case formed from an aluminum alloy so that lost heat generated by the semiconductor lasers 20 can be dissipated easily.

In the present configuration, the surface 36 is in the form of a planar, flat, uncurved surface and the semiconductor lasers 20 are arranged in columns and rows thereon. The arrangement is in this case such that they are arranged next to one another on a plane oriented transversely with respect to the optical axes.

For this purpose, the carrier 38 has four bar-shaped carrier elements 40, on which the semiconductor lasers 20 are arranged. The carrier elements 40 are arranged on a common carrier frame 42 of the carrier 38 parallel to one another on a plane oriented transversely to the optical axes 22. In this case, the carrier elements 40 are also formed from the same material as the carrier 38. In various embodiments, provision may be made for the carrier elements 40 to be formed integrally with the carrier 38. This configuration enables very good thermal coupling of the carrier elements 40 to the carrier 38, with the result that high-performance heat dissipation from the semiconductor lasers 20 can be realized.

Along a respective carrier element 40, the semiconductor lasers 20 arranged thereon are arranged in a row along a longitudinal extent of the carrier element 40. Respective laser light emission sides 24 of the semiconductor lasers 20 are arranged opposite the surface 36. In the present configuration, provision is made for the carrier elements 40 to have a rectangular cross section transversely to the longitudinal extent. Depending on the application case, in other embodiments a different cross-sectional shape can also be provided, for example in the form of N-sided polygons, curves, combinations thereof or the like.

Figure 2:
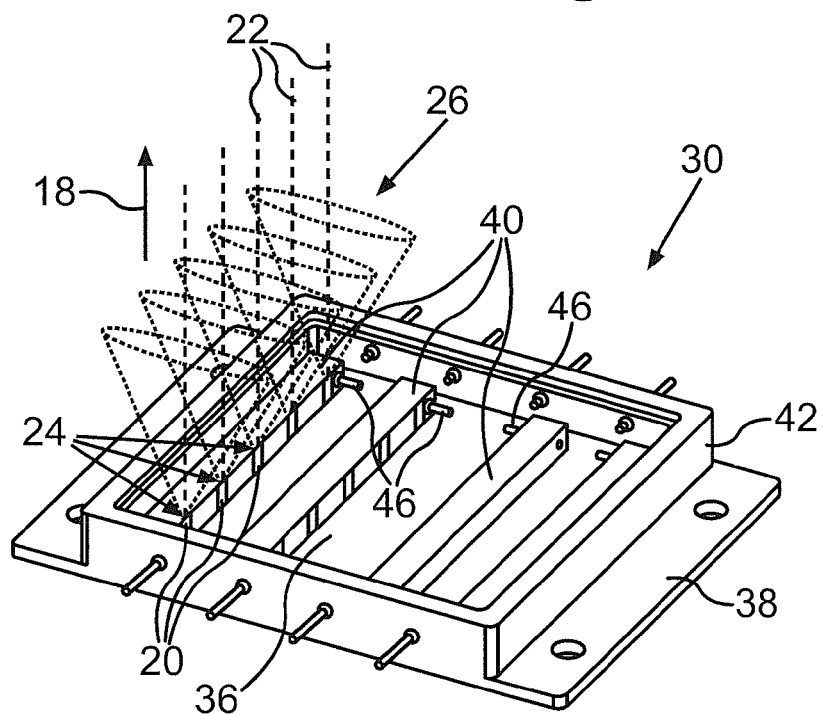
FIG. 2 shows a schematic perspective view as shown in FIG. 1, wherein light source cones of the individual semiconductor laser light sources are illustrated in supplementary fashion schematically for a carrier element of the carrier.

FIG. 2 shows a perspective schematic view as shown in FIG. 1, in which light cones of the laser light 26 emitted by the semiconductor lasers 20 are also illustrated, however. It can be seen from FIG. 2 that the semiconductor lasers 20 emit the laser light 26 with a high degree of divergence. As will be explained further below, a following primary optical element for collimation is expedient for many applications. In order to be able to achieve efficient guidance of the laser light beams, the primary optical element is preferably provided in the beam path such that deflection takes place before the beam paths are superimposed by means of a deflection unit 32. The primary optical element may be part of the deflection unit 32 (FIG. 3).

Figure 3:
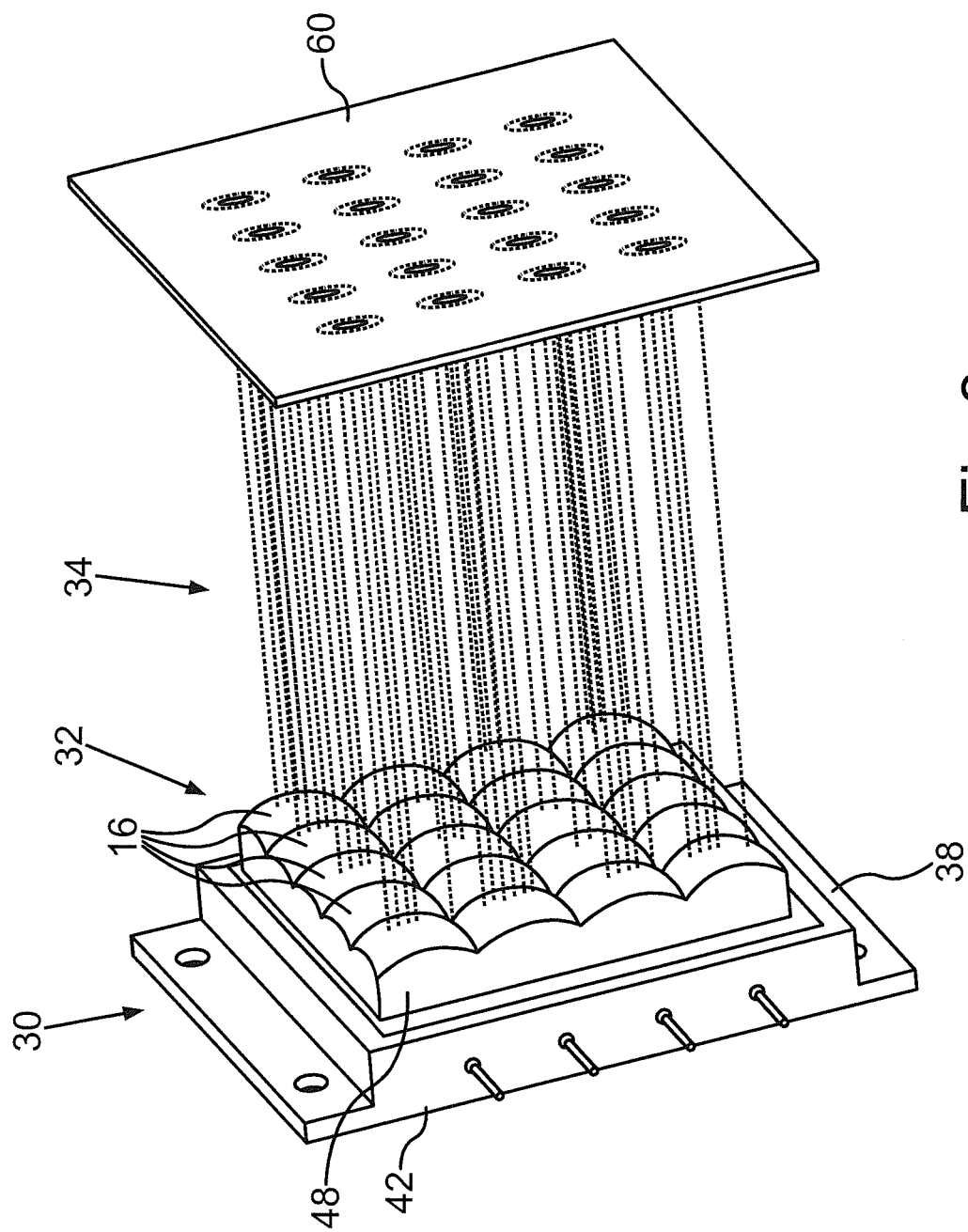
FIG. 3 shows a schematic perspective view of a carrier for a light source arrangement in accordance with various embodiments including a deflection unit, which has a lens array, and including a beam bundle provided by the lens array.

A configuration for a deflection unit 32 which has a primary optical element in the form of a lens array 48 is illustrated in FIG. 3. The lens array 48 is formed by an integral transparent component part, which provides an associated lens 16 for each semiconductor laser 20. This lens array 48 may be connected to the carrier frame 42 so that a closed housing for the semiconductor lasers 20 is formed.

The number of carrier elements 40, the number of semiconductor lasers 20 and also spacings transversely to the extent of the carrier elements 40 may vary depending on the physical shape of the housing and position of electrical contacts and requirements as regards the optical power.

It may furthermore be seen from FIG. 3 that the light source arrangement 30, together with the lens array 48, leads to a radiation field 60, in which the laser light beams of the beam bundle 34 have ellipsoidal cross sections, which occur in columns and rows corresponding to the arrangement of the semiconductor lasers 20.

In a further configuration in accordance with various embodiments, provision is made for the semiconductor lasers 20 arranged jointly on a carrier 38 to be individually controllable. Naturally, provision can also be made for, in another embodiment, the semiconductor lasers 20 to be controlled in groups, for example all semiconductor lasers 20 arranged on one carrier element 40 jointly. For this purpose, energy supply connections 46 for the semiconductor lasers 20 may be arranged at front-side ends of the bar-shaped carrier element 40. The connections 46 may be designed correspondingly to the mechanical requirements so that electrical energy can be supplied to the semiconductor lasers 20 properly. In various embodiments, corresponding energy supply connections 46 are provided depending on the desired control.

Figures 4, 5:
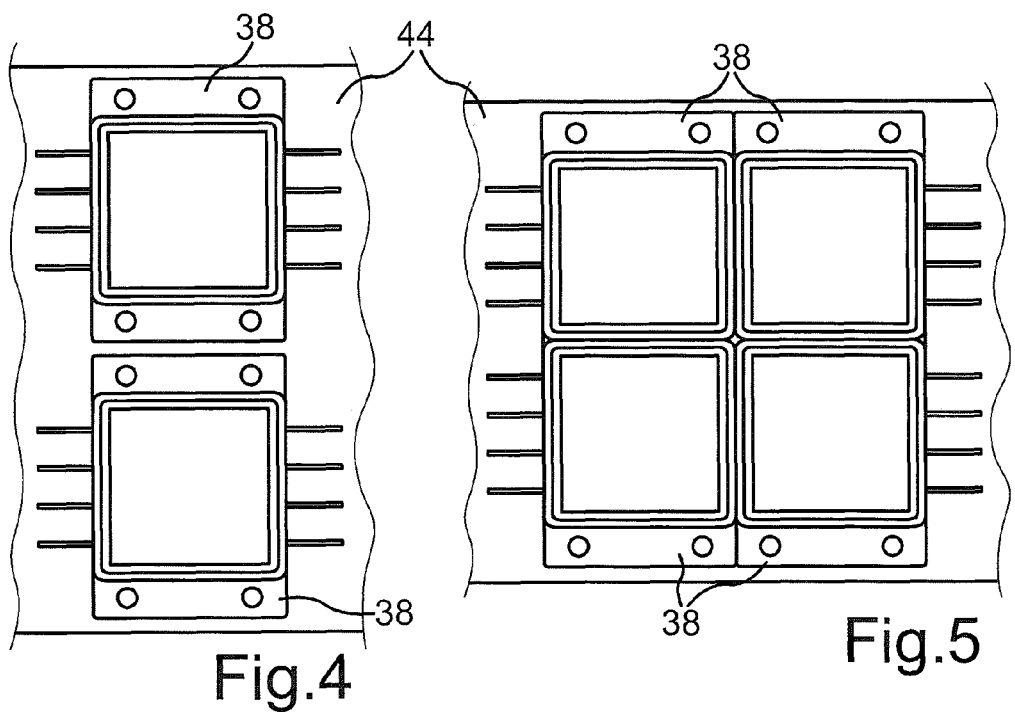
FIG. 4 shows a schematic plan view of a light source arrangement including two carriers in accordance with various embodiments, which are fastened on a cooling body next to one another.
FIG. 5 shows a schematic plan view of an alternative light source arrangement including four carriers in accordance with various embodiments, which are fastened in pairs jointly on a single cooling body.

FIG. 4 illustrates a schematic plan view of carriers 38 arranged on a cooling body 44. The carriers 38 do not have dedicated lugs which surround bores, which make it possible to connect the carriers 38 to the cooling body 44 by a screw fastening. By virtue of this configuration it is possible to dissipate the lost heat of the semiconductor lasers 20 such that a compact design with a high optical luminous efficacy can be achieved.

FIG. 5 shows a further configuration for fastening carriers 38 on the cooling body 44, wherein, in this configuration, the carriers 38 are each of dual design so that the carriers 38 are connected in pairs to the cooling body 44. As a result, in the case of a high cooling power, it is possible for the overall design to be made even more compact. Alternative embodiments may provide population with as few gaps as possible by virtue of corresponding housing shapes of the carriers 38 and adapted contact-making.

Figure 6:
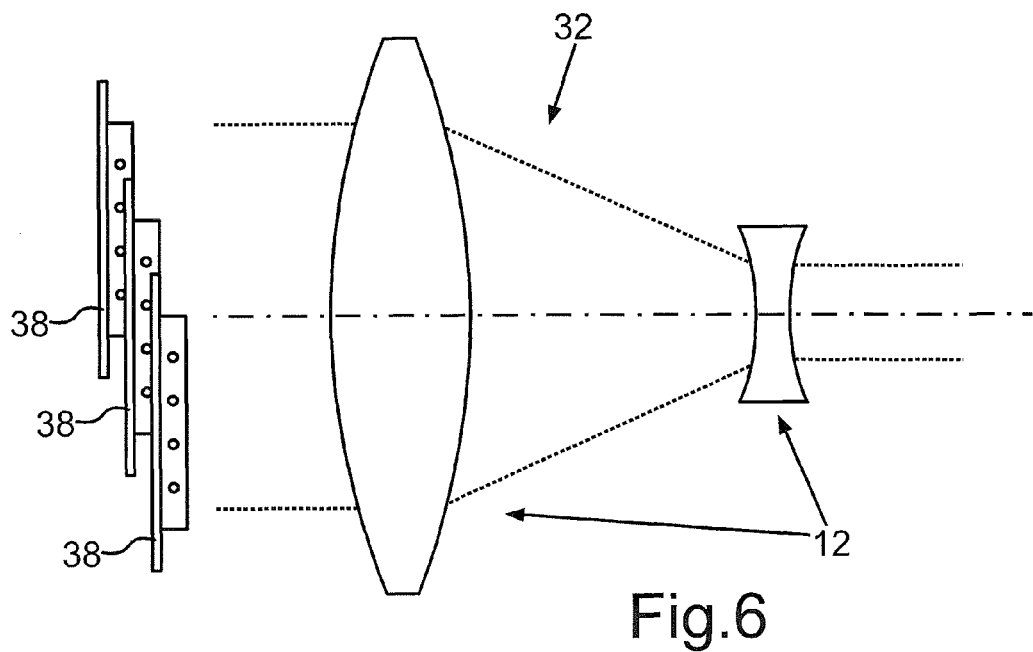
FIG. 6 shows a schematic illustration in sectional view for a deflection unit which is designed to combine the laser light from semiconductor laser light sources of a plurality of carriers.

FIG. 6 shows, in a schematic, partially perspective side view, a light source arrangement including three carriers 38 arranged next to one another in accordance with various embodiments. The carriers 38 are arranged on one plane and are fastened on a common cooling body (not illustrated in FIG. 6). FIG. 6 shows the three carriers 38 offset with respect to one another, but in the actual configuration they lie on a planar plane, however. The light source arrangement shown in FIG. 6 furthermore includes a deflection unit 32 including a lens array 12, which is designed in such a way that all of the beam paths of the beam bundles of the carriers 38 are detected and combined to form a common beam bundle. In alternative embodiments, provision may be made for the carriers 38 to be arranged on different planes with respect to one another. In various embodiments, however, the optical axes of their semiconductor lasers 20 should be oriented in the same spatial direction 18. The deflection unit 32 shown in FIG. 6 has the effect that the radiation field 60 is reduced in size, with the result that optical elements following in the beam path can be reduced in terms of their dimensions.

Figure 8:
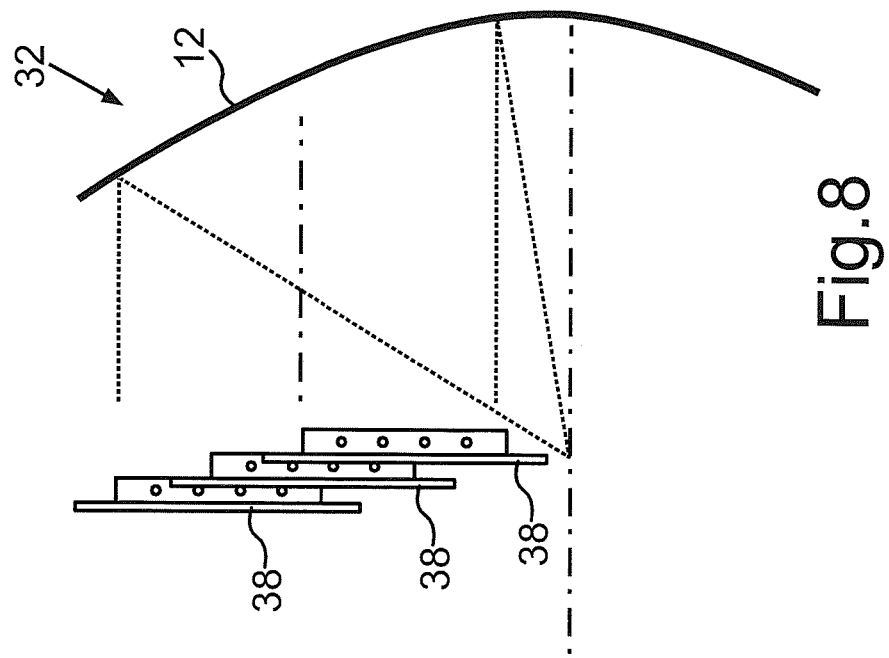
FIG. 8 shows an alternative to the embodiment shown in FIG. 7 with a freeform mirror, but the mirror has a focal point next to the arrangement of the carriers.
Figure 7:
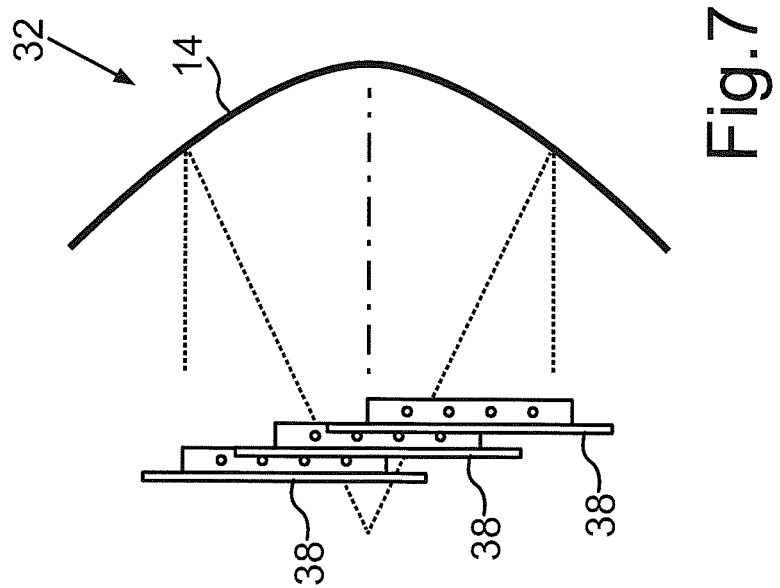
FIG. 7 shows a light source arrangement including three carriers in accordance with various embodiments in a schematic side view, wherein the deflection unit in accordance with a first configuration has a parabolic mirror, wherein the focal point of the parabolic mirror is formed in the region of the arranged carriers.

FIGS. 7 and 8 show two further configurations on the basis of the configuration shown in FIG. 6, wherein the deflection unit 32 has a parabolic mirror 14 instead of a lens array in the configuration shown in FIG. 7. In FIG. 8, instead of the parabolic mirror 14, a freeform mirror 12 is provided. The mirrors 12, 14 are used for focusing the beam bundle 34. In FIG. 7, provision is made for the focusing to take place centrally with respect to the carriers 38. In the configuration shown in FIG. 8, provision is instead made for focusing to take place laterally with respect to the carriers 38.

Figure 9:
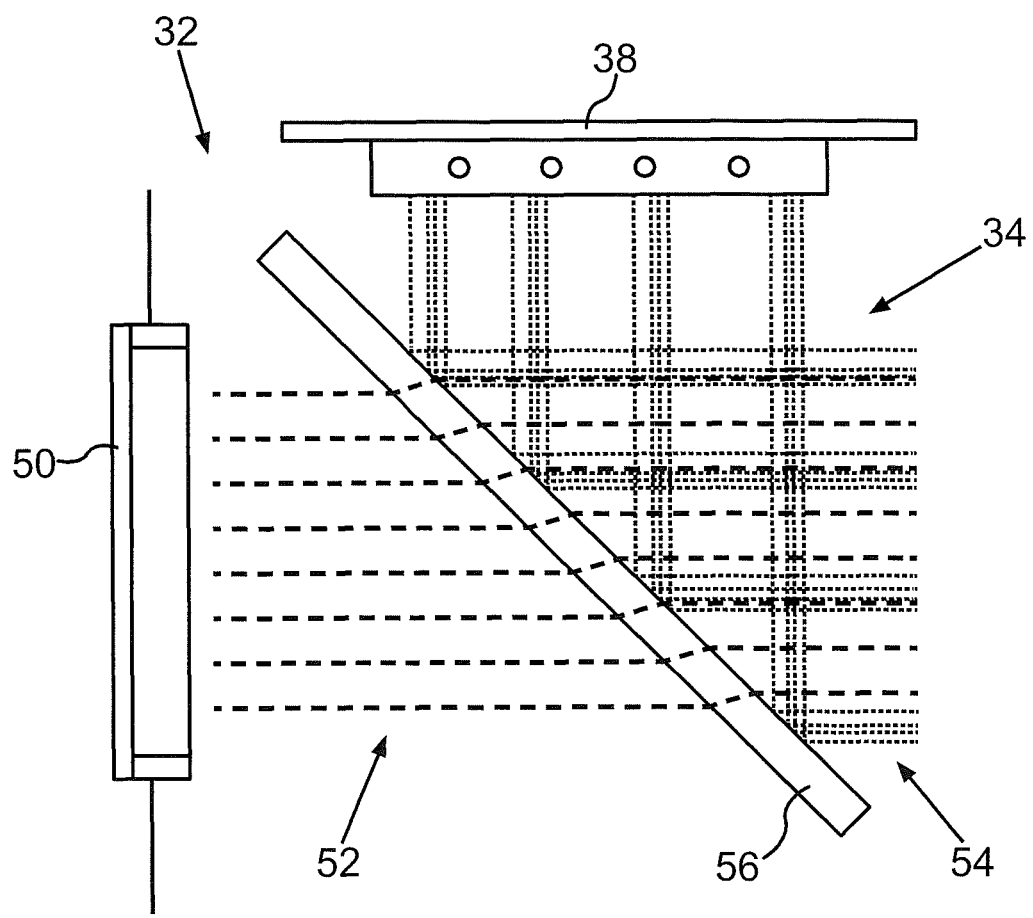
FIG. 9 shows a schematic illustration of a light source arrangement in a sectional view including two carriers arranged at an angle to one another in accordance with various embodiments, wherein the laser light generated by the carriers is combined by a polarization beam splitter to form a common radiation field.

FIG. 9 shows a further configuration of a light source arrangement in accordance with various embodiments, in which two carriers 38, 50 are provided, which are arranged physically with respect to one another at right angles. The deflection unit 32 may be designed to deflect the beam paths 34, 52 of all of the semiconductor lasers 20 of at least one of the carriers 38, 50 in such a way that they form, together with the beam paths 34, 52 of all of the semiconductor lasers 20 of the second of the carriers 38, 50, a common beam bundle 54. For this purpose, provision is made in this configuration for the deflection unit 32 to have a polarization beam splitter 56, which is designed to deflect the beam paths 34, 52 of the semiconductor lasers 20 arranged on the carriers 38, 50 of the two carriers 38, 50 in order to form the common beam bundle 54. This configuration makes it possible to superimpose the radiation fields of the carriers 38, 50 without substantially enlarging the common radiation field of the beam bundle 54. As a result, a very compact follow-on optical element can furthermore be used, corresponding to the desired application. In various embodiments, the beam bundle 52 of the carrier 50 is P-polarized, whereas the beam bundle 34 of the carrier 38 is S-polarized. Naturally, the opposite polarization can also be provided. In various embodiments, the angles of incidence are approximately 45° or the Brewster angle. The latter makes it possible to use an uncoated rear side of the polarization beam splitter 56. Naturally, other angles of incidence are also possible for arriving at the further configurations within the meaning of various embodiments.

FIGS. 10 and 11 show a further embodiment of a deflection unit 32 of a light source arrangement in accordance with various embodiments, in which the deflection unit 32 has a number of strip mirrors 58, which are assigned to a first carrier 38 and are designed to deflect the laser light emitted by the semiconductor lasers 20 arranged on the assigned carrier 38 in order to form the common beam bundle 54. Only the lens array 48 of the corresponding carriers 38 is illustrated in FIGS. 10 and 11. With the strip mirrors 58, it may be possible to couple the laser light of the carrier 38 into the beam bundle 52 of the laser light of the carrier 50 without substantially enlarging the radiation field 60. In this configuration, provision is made for the strip mirrors 58 to each be assigned to a carrier element 40 of the carrier 38. In the left-hand region of FIGS. 10 and 11, in each case a schematic sectional view is illustrated, whereas in the central region of FIGS. 10 and 11, a correspondingly associated perspective illustration is illustrated. In the right-hand region of FIGS. 10 and 11, in each case generated associated radiation fields 60 corresponding to the embodiment are illustrated.

While in FIG. 10 the individual beams are oriented in rows and columns, in the radiation field 60 shown in FIG. 11 the laser beams are only arranged in rows, but offset with respect to one another. In this configuration too, the radiation field 60 is not substantially enlarged by the superimposition of the laser light of the carriers 38, 40. Even when the configuration shown in FIGS. 10 and 11 for the laser light of the carrier 38 provides a deflection of 90° by the strip mirrors 58, other angles may also be provided, depending on requirements.

A further configuration of a light source arrangement in accordance with various embodiments which is based on the embodiment shown in FIG. 11 is illustrated using FIG. 12. In contrast to the configuration shown in FIG. 11, the configuration shown in FIG. 12 provides a break in the symmetry in the form of tilting of the laser light beams in the radiation field 60. The strip mirrors 58 are adjusted correspondingly. Naturally, a rotation or an offset and combinations thereof may also be provided.

FIG. 13 shows a further configuration of a light source arrangement in accordance with various embodiments, in which, however, in contrast to the exemplary embodiments shown in FIGS. 10 to 12, the laser light of two carriers 38, 50, which are arranged opposite one another, is superimposed. A deflection unit 32 is provided between the two carriers 38, 50, said deflection unit providing strip mirrors 48 assigned for each of the carriers 38, 50. In the left-hand region of FIG. 13, a schematic sectional view is illustrated. In the central region of FIG. 13, an associated perspective illustration of the light source arrangement is illustrated. In the right-hand region, a radiation field 60 generated by this light source arrangement is illustrated. The radiation field 60 corresponds to that which is generated by the light source arrangement shown in the exemplary embodiment in FIG. 11. The further components and the design of the carriers 38, 50 have already been explained in detail in relation to the preceding exemplary embodiments, for which reason reference is made here to these exemplary embodiments in supplementary fashion.

In the case of coupling by strip mirrors 58, as has been described on the basis of the embodiments shown in FIGS. 10 to 13, a linearly polarized radiation field 60 with double the optical luminous efficacy of a single carrier 38, 50 can be generated. If this embodiment is combined with the embodiment already explained with respect to FIG. 9 with the principle of polarization coupling, the beam bundles of four carriers can be superimposed on one another in a simple manner without the radiation field 60 of a single carrier 38, 50 being enlarged critically. In various embodiments in the case of superimposition of the beam bundles of more than four carriers, within the scope of further embodiments, provision may be made in at least supplementary fashion for a mirror arrangement to be provided. Such a configuration avoids or reduces the use of large, heavy lenses. Furthermore, owing to folding of the beam path of the beam bundles as a result of the interaction of at least two mirrors, a short physical length may be achieved in comparison with a simple lens system.

In the case of laser-activated remote phosphor (LARP) adaptive front-lighting (AFS) systems, a light source arrangement can be provided in which the beam bundle 54 illuminates an imager through a deflection unit 32. An imager may be a digital light processing (DLP)™ module, for example in the form of a chip or the like. It may also be in the form of liquid crystal on silicon (LCoS) or liquid crystal display (LCD). The imager in turn may generate an image on a flat remote phosphor target. The image converts the excitation wavelength of the laser beam bundle 54 entirely or partially. The image generated in this way can be projected onto a projection plane in order to generate a desired illumination. In the case of a vehicle headlamp, the abovementioned projection plane can be formed by the road.

Potential use possibilities:
Owing to the superimposition of laser light beams from two or more carriers, an array of laser light beams are produced. Owing to a suitable arrangement of the semiconductor lasers and the strip mirrors, a point matrix of the array can be matched to a mirror array of a DLP™.
In the case of a laser array, the individual semiconductor lasers may be actuated individually. Therefore, regions can be switched so as to be dark in a desired manner on an imager, formed e.g. by a DLP™. This may result in the following effects:
1. less power on the DLP™, as a result of which reflectivity of the imager mirror of less than 100% results. The content of non-reflected light results in heating of the mirror. This heat needs to be dissipated out of the imager again.

2. Owing to targeted disconnection of segments in the illumination field, parasitic light may be reduced. This may contribute to an improvement of the imaging contrast. This may be provided in the case of vehicle headlamps.

3. The disconnection of presently unrequired lighting segments increases the system efficiency without needing to accept losses of optical performance.

Owing to the targeted tilting of two or more beam bundles with respect to one another, the periodicity in the optical illustration can be broken. As a result, diffraction-like effects in the optical system can be suppressed, which diffraction effects can occur owing to the periodic summation of many small effects.

In relation to the configuration shown in FIG. 13, further effects may be achieved if the shape of the strip mirror 58 is bent, for example in the form of a strip-shaped segment of the shell of a sphere. As a result, the beam bundle may be focused very well onto one line in one axis. This may be achieved by virtue of the fact that in each case the laser light of a linear arrangement of semiconductor lasers 20 is focused on one point. In an MDP, there are a plurality of such linear arrangements. Owing to the plurality of bent strip mirrors 58, a linear arrangement of points of light in the form of a line can thus be achieved. If in this case the strip mirrors 58 are tilted individually towards one another, it is possible to focus the linear arrangement of the points of light on a single point. The focusing thus achieved is characterized by low optical losses and a very compact design. In various embodiments, a very small beam widening up to the following optical element in the beam path or a large snap angle may be achieved.

FIG. 14 shows a corresponding configuration of a further light source arrangement including curved strip mirrors 58. In a left-hand illustration in FIG. 14, there is again schematically a sectional illustration of such a light source arrangement, wherein only one of the two carriers, namely the carrier 50 is illustrated. The opposite carrier 38 is not illustrated in the left-hand illustration for reasons of clarity. In the right-hand region of FIG. 14, a corresponding completed perspective view of this light source arrangement is illustrated. In the central region in FIG. 14, a corresponding radiation field 60 generated by this light source arrangement is illustrated, which radiation field shows a linear arrangement of laser spots. Therefore, a conversion element (not illustrated) arranged on the plane of the radiation field 60 can be excited linearly. Furthermore, it is possible to arrange the conversion element in front of or after the mentioned plane as well. Depending on the position of the conversion element, different laser power densities can be raised on the conversion element. In addition, the position of the conversion element can also be changed temporarily, for example oscillating and/or selected as desired between different positions, for example controlled by an external control signal. As possible configurations of the strip mirrors 58, spherical, parabolic, freeform curvatures, combinations thereof or the like in one or two spatial directions are possible. In FIG. 14, a spherical curvature in one direction in the form of a cylinder cutout is provided. Although this can cause imaging errors, these can be reduced by other mirror geometries, such as a paraboloid, for example. In addition, the curvature of the strip mirrors can also be changed temporarily by actuators, for example piezoelectric elements, for example can be selected as desired in oscillating fashion and/or between different positions, for example controlled by an external control signal.

As a continuation of the concept of bent strip mirrors, further effects can be achieved:

1. the curvature of the strip mirrors can be changed dynamically by actuators, for example on the basis of piezoelectric elements. Therefore, an adaptive deflection unit can be achieved.

2. The tilting angle of the strip mirrors 58 can likewise be set dynamically by actuators. As a result, the luminance distribution in the illumination window can be matched dynamically. It is therefore no longer necessary to switch unused regions of an imager to be dark. Instead, it is possible to concentrate the laser light in the presently active regions of the imager. This may be advantageous e.g. when using DLP™ imagers. As a result, it is no longer necessary to reflect unused light back into the system and to eliminate this light in the case of DLP™ images which are areally illuminated. With the dynamic luminance regulation in the illumination field of the DLP™, the light can be concentrated where it is required at present. As a result, a significant increase in system efficiency can be achieved.

Figure 15:
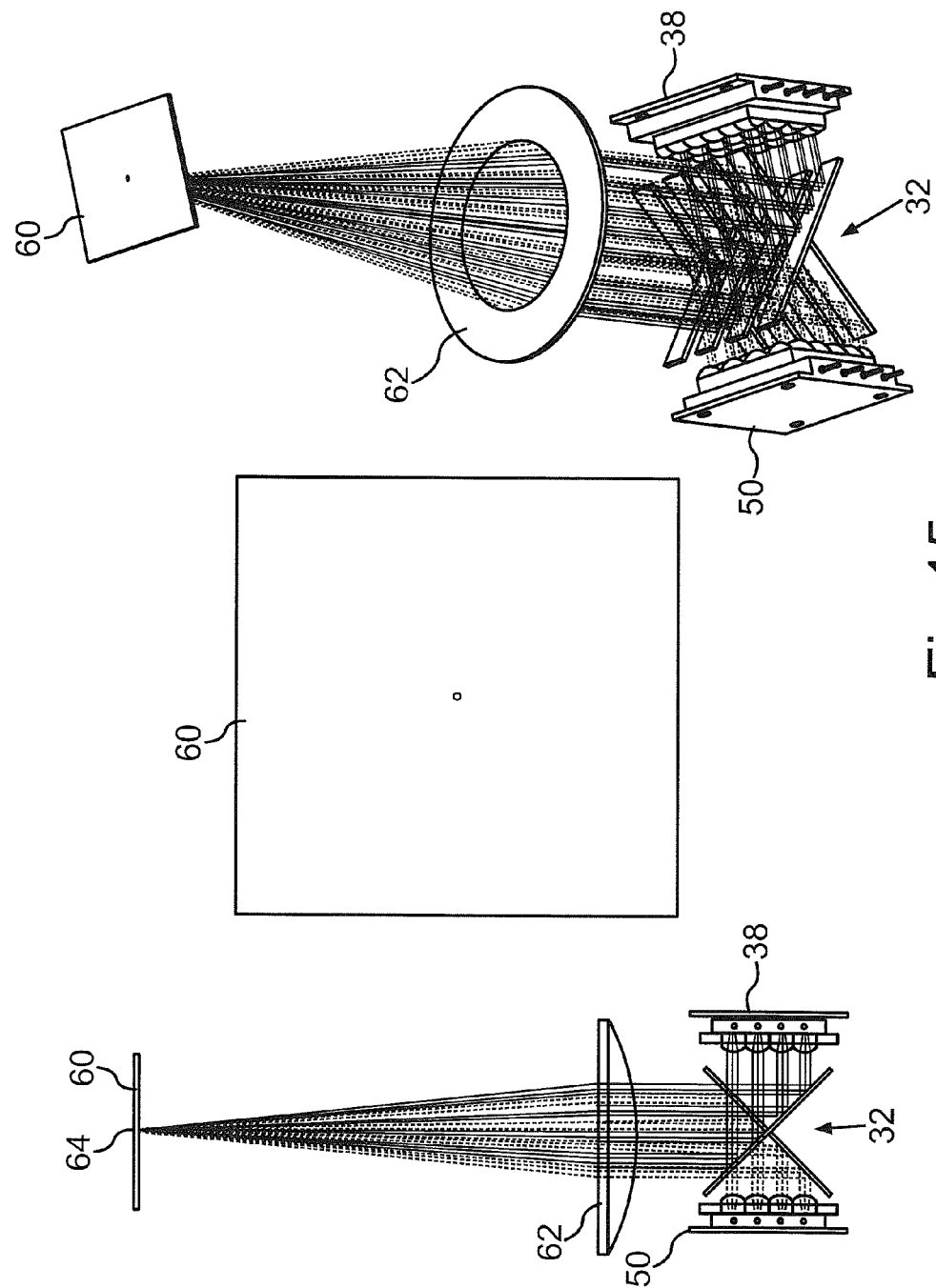
FIG. 15 shows a configuration based on the configuration shown in FIG. 13 for a further light source arrangement including two mutually opposite carriers in accordance with various embodiments, wherein the deflection unit in this case includes, in addition to the configuration shown in FIG. 13, a converging lens, so that the deflection unit focuses all of the laser light which is generated by the two carriers on a common point, in the right-hand region of FIG. 15 a corresponding perspective illustration of this light source arrangement and, in the central region, an illustration of the radiation field generated by the deflection unit.

FIG. 15 shows a configuration of a further light source arrangement in accordance with various embodiments on the basis of the configuration as has been explained already in relation to FIG. 13. Only the supplementary differences will be explained below. In FIG. 15, in contrast to FIG. 13, a converging lens 62 is provided, which is likewise part of the diffraction unit 32. Using the converging lens 62, the laser light provided by the light source arrangement shown in FIG. 13 can be focused onto a focusing point 64 in the radiation field 60. In the left-hand region of FIG. 15, a schematic sectional illustration is shown, whereas in the right-hand region of FIG. 15, a corresponding perspective view of this light source arrangement is illustrated. In the central region, the radiation field of this light source arrangement at the focusing point 64 is illustrated. The focusing of all of the semiconductor lasers 20 onto one point is possible with the configuration shown in FIG. 15. The dimensions of the minimum focusing that can be achieved with fixed optical elements are primarily dependent on tolerances and imaging errors.

Figure 16:
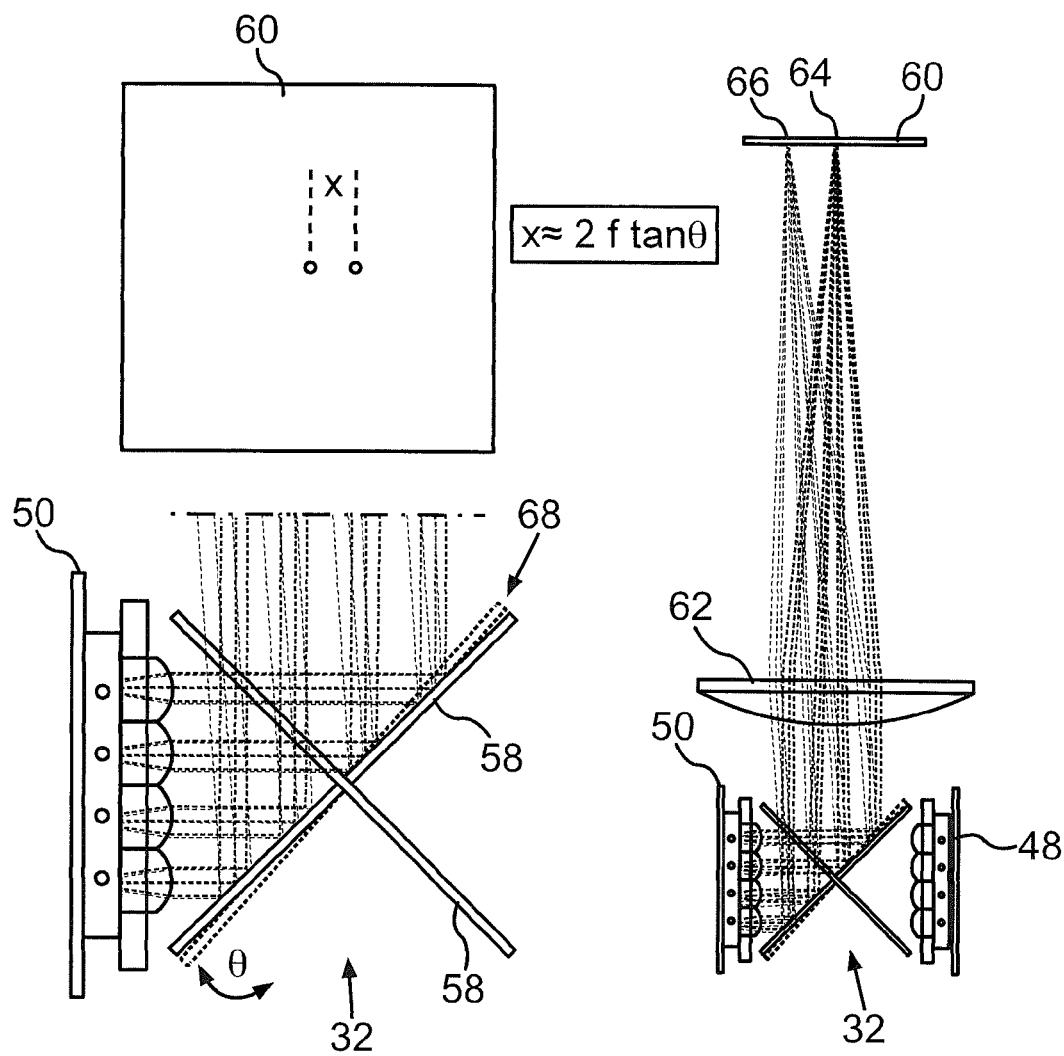
FIG. 16 shows, in the left-hand, lower region, a detail of a further light source arrangement as shown in FIG. 13, wherein only one of two carriers arranged opposite one another is illustrated, wherein a deflection unit with pivotable strip mirrors is provided, in the right-hand region of FIG. 16, a corresponding schematic sectional view of a completed illustrated in accordance with the left-hand lower region, wherein the deflection unit additionally has a converging lens as in FIG. 15, so that the laser light generated by the carriers is focused at two focal points, and, in the left-hand upper region, an illustration of the radiation field generated by the deflection unit.

FIG. 16 shows a further configuration of a light source arrangement in accordance with various embodiments which is based on a development of the configuration shown in FIG. 15. In contrast to the embodiment shown in FIG. 15, in the embodiment shown in FIG. 16 an adaptation of the optical system is also possible. This is achieved by tilting at least one of the strip mirrors 58. An enlarged sectional illustration of the deflection unit 32 is illustrated in the left-hand bottom region of FIG. 16, whereas a completed illustration is shown in the right-hand region, which shows that two focusing points 64, 66 are generated in a radiation field 60 illustrated in the left-hand upper region of FIG. 16. By tilting, a beam deflection on a focal plane is possible. In addition, a rapid movement of the mirrors provides the possibility of homogenization or intensity control over a dwell time. In combination with individual controllable semiconductor lasers 20 and individually controllable strip mirrors 58, a high degree of flexibility for many LARP applications can be achieved. For example, any desired mirror shapes, carrier geometries, adjustment principles and/or combinations thereof may be provided, which can also be combined with following optical elements for beam guidance or beam shaping.

The above-explained embodiments serve merely to explain the invention and are not restrictive for the invention. The invention can be used not only in the case of headlamps for motor vehicles, but also generally in light-emitting means for lamps, e.g. with high luminous efficacies.

Finally, naturally features of the claims and the description can be combined with one another in virtually any desired manner in order to arrive at further configurations within the meaning of the invention. In various embodiments, apparatus features can also be realized by corresponding method steps, and vice versa.

Thus, for example, the orientation of the beam profiles of the semiconductor lasers, i.e. specifically the orientation of the fast axis, does not need to be oriented uniformly, but can be set freely corresponding to requirements. In this way, beam profile patterns can be generated which then as a result generate likewise different intensity distributions which are matched to the specific lighting task on a conversion element. The respective semiconductor lasers of a multi-die package can also have a respectively different polarization orientation. The laser light sources can be operated individually, in groups or as a whole in clocked or pulsed fashion, wherein the clocked times of the individual laser light sources or of the laser light sources connected to one another in each case to form a string can be adjusted variably, i.e. can also be different. The respective laser light sources of a multi-die package can also each be operated individually with different operating modes, for example with different clock times and energization values. Specifically, this means that each individual laser diode is actuable directly and independently of the other laser diodes of the multi-die package. This may have the effect that, as a result, the energy density distribution of the laser spot on the conversion element may be varied or adjusted depending on requirements.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A light source arrangement, comprising:
   a plurality of semiconductor laser light sources, each having an optical axis, wherein the semiconductor laser light sources are arranged in such a way that their optical axes are oriented parallel to one another so that respective laser light emission sides of the semiconductor laser light sources point in the same spatial direction; and
   a deflection unit configured to collect and influence beam paths of the laser light emitted by the semiconductor laser light sources in order to form a beam bundle;
   wherein the semiconductor laser light sources are arranged on a surface of a carrier, distributed at least two-dimensionally over the surface,
      wherein the carrier has at least two bar-shaped carrier elements, on which the semiconductor laser light sources are arranged,
   wherein the carrier elements are arranged on a common carrier frame of the carrier parallel to one another on a plane oriented transversely to the optical axes, and
      wherein energy supply terminals for the semiconductor laser light sources arranged at front-side ends of the bar-shaped carrier element.

2. The light source arrangement of claim 1, further comprising:
   a cooling unit arranged on the carrier.

3. The light source arrangement of claim 2,
   wherein the cooling unit is connected to the carrier frame.

4. The light source arrangement of claim 1,
   wherein the semiconductor laser light sources arranged together on a carrier are controllable individually or in groups.

5. The light source arrangement of claim 1,
   wherein a lens array is arranged on the carrier on the semiconductor laser light source side, said lens array providing a lens for the laser light emitted by the respective semiconductor laser light source for each semiconductor laser light source.

6. The light source arrangement of claim 5,
   wherein the deflection unit has a number of strip mirrors, which are assigned at least to the first of the carriers and are designed to influence the laser light emitted by the semiconductor laser light sources arranged on the respectively assigned carrier, and
   wherein the semiconductor laser light sources are arranged in rows and columns on the surfaces of the carriers and are designed to each correspondingly generate a first and second beam bundle formed in columns and rows,
   wherein the strip mirrors are designed to deflect the first beam bundle generated by the semiconductor laser light sources arranged on the first of the carriers in such a way that the first beam bundle is offset with respect to the second beam bundle generated by the semiconductor laser light sources arranged on the second carrier in respect of the column and row arrangement.

7. The light source arrangement of claim 6,
   wherein the strip mirrors are designed to deflect the first beam bundle generated by the semiconductor laser light sources arranged on the first of the carriers in such a way that the first beam bundle is offset with respect to the second beam bundle generated by the semiconductor laser light sources arranged on the second carrier in respect of the column and row arrangement by approximately at least one of half a row or half a column.

8. The light source arrangement of claim 6,
   wherein the strip mirrors are designed to generate an offset in the manner of a shift, tilt and/or rotation of the first and second beam bundles with respect to one another.

9. The light source arrangement of claim 1,
   wherein two carriers, each having semiconductor laser light sources, which are arranged in rows and columns on a surface of each carrier, are arranged with respect to one another in such a way that their surfaces with the semiconductor laser light sources are opposite one another,
   wherein a deflection unit having a number of strip mirrors is arranged between the two carriers, wherein in each case one strip mirror is assigned to each column or row with semiconductor laser light sources of the two carriers in such a way that the beam paths of the semiconductor laser light sources are deflected by the strip mirrors into the same half-space.

10. The light source arrangement of claim 9,
    wherein the strip mirrors alternately face, tilted, one or the other carrier,
    wherein the tilt angle enclosed between the beam paths of the assigned semiconductor laser light sources of the respective carrier and the surface normal of the relevant mirror surface is at least approximately 45°.

11. The light source arrangement of claim 9, wherein the strip mirrors alternately face, tilted, one or the other carrier, wherein, in the case of at least one strip mirror, the surface facing a column or row is curved in such a way that at least two of the beam paths of the assigned semiconductor laser light sources cross over at a distance from this strip mirror.

12. The light source arrangement of claim 9, wherein the strip mirrors are designed to generate an offset in the manner of a shift, tilt and/or rotation of the first and second beam bundles with respect to one another.

13. The light source arrangement of claim 1, wherein two carriers are provided which are arranged spatially at an angle to one another, wherein the deflection unit is designed to influence the beam paths of all of the semiconductor laser light sources of at least one first one of the carriers in such a way that, together with the beam paths of all of the semiconductor laser light sources of a second of the carriers, they form a common beam bundle.

14. The light source arrangement of claim 13, wherein the deflection unit has a polarization beam splitter, which is designed to deflect the beam paths from the semiconductor laser light sources, arranged on the carriers, of the two carriers.

15. The light source arrangement of claim 13, wherein the deflection unit has a number of strip mirrors, which are assigned at least to the first of the carriers and are designed to influence the laser light emitted by the semiconductor laser light sources arranged on the respectively assigned carrier.

* * * * *